(12) United States Patent
Tashkandi et al.

(10) Patent No.: US 10,817,649 B2
(45) Date of Patent: Oct. 27, 2020

(54) UNICODE CONVERSION WITH MINIMAL DOWNTIME

(71) Applicant: Saudi Arabian Oil Company, Dhahran (SA)

(72) Inventors: Alalaa N. Tashkandi, Dhahran (SA); Fayez M. Alsofyani, Dhahran (SA); Abdulaziz I. Mulhim, Dhahran (SA)

(73) Assignee: Saudi Arabian Oil Comapny, Dhahran (SA)

( * ) Notice: Subject to any disclaimer, the term of this patent is extended or adjusted under 35 U.S.C. 154(b) by 283 days.

(21) Appl. No.: 15/865,947

(22) Filed: Jan. 9, 2018

(65) Prior Publication Data

US 2019/0213239 A1  Jul. 11, 2019

(51) Int. Cl.
```
G06F 40/126      (2020.01)
H03M 7/30        (2006.01)
G06F 16/10       (2019.01)
G06F 16/21       (2019.01)
```

(52) U.S. Cl.
CPC .......... *G06F 40/126* (2020.01); *G06F 16/10* (2019.01); *G06F 16/214* (2019.01); *H03M 7/705* (2013.01)

(58) Field of Classification Search
CPC ......... G06F 17/30; G06F 11/36; G06F 40/126
See application file for complete search history.

(56) References Cited

U.S. PATENT DOCUMENTS

| | | | |
|---|---|---|---|
| 6,256,634 B1 * | 7/2001 | Moshaiov | ........... G06F 16/2308 |
| 8,386,741 B2 | 2/2013 | Gupta et al. | |
| 8,769,127 B2 | 7/2014 | Selimis et al. | |
| 9,158,804 B1 | 10/2015 | Rangapuram et al. | |
| 9,785,645 B1 * | 10/2017 | Chen | ................. G06F 16/211 |
| 2005/0049997 A1 * | 3/2005 | Shipp | .................. G06Q 10/107 |
| 2014/0007092 A1 * | 1/2014 | Barbee | ................ G06F 9/5077 718/1 |
| 2014/0281732 A1 * | 9/2014 | Elias | .................. G06F 11/3668 714/38.1 |
| 2015/0006476 A1 * | 1/2015 | Engelko | ............... G06F 16/214 707/609 |
| 2016/0170977 A1 | 6/2016 | Engelko et al. | |

(Continued)

FOREIGN PATENT DOCUMENTS

WO   WO2016078420   5/2016

OTHER PUBLICATIONS

Debowski, "Near Zero Downtime: Reduction of Business Downtime," SAP Architecture Bluebook, Aug. 2010, 29 pages.

(Continued)

*Primary Examiner* — Giovanna B Colan
(74) *Attorney, Agent, or Firm* — Fish & Richardson P.C.

(57) ABSTRACT

Prior to performing a Unicode conversion of a productive system and during an uptime processing stage of the productive system, files in the productive system are mapped to a cluster file system. Prior to the Unicode conversion and during an uptime processing stage of the productive system, a clone system of the productive system is generated using the cluster file system. Prior to the Unicode conversion and during an uptime processing stage of the productive system, the clone system is tested. During a downtime processing stage of the productive system, the Unicode conversion is performed. The clone system is activated, including making the clone system the productive system.

20 Claims, 7 Drawing Sheets

(56) References Cited

U.S. PATENT DOCUMENTS

2017/0060936 A1* 3/2017 Gammans ............ G06F 16/2358
2017/0323112 A1* 11/2017 Tran ...................... G06F 16/258
2018/0075262 A1* 3/2018 Auh ...................... H04L 9/3242

OTHER PUBLICATIONS

Burckel et al., "Guidelines for Unicode Projects," in Unicode in SAP Systems, Galileo Press, 2007, 35 pages.
Riedel, "Executing an Upgrade Project," in Managing SAP ERP 6.0 Upgrade Projects, Galileo Press 2009, 41 pages.
WBM 1058 et al., "Clustered file System—Wikipedia," en.wikipedia.ord, available on or before Mar. 31, 2016, retrieved on Jun. 30, 2017, retrieved from URL <https://en.wikipedia.org/w/index.php?title=Clustered_file_system&oldid=712773823> , 7 pages.
International Search Report and Written Opinion issued in International Application No. PCT/US2019/012860 dated Apr. 10, 2019, 18 pages.

* cited by examiner

UNICODE CONVERSION WITH MINIMAL DOWNTIME

BACKGROUND

Unicode is a computing industry standard for consistent representation of text. The consistent representation supports encoding and handling of text for most of the world's languages. Textual information from different languages can be stored in a single repository. A single set of source code can be written to process data in virtually all languages. Many companies convert their non-Unicode system to a Unicode system in order to lower their long-term implementation costs.

SUMMARY

The present disclosure describes techniques that can be used for Unicode conversions.

In some implementations, a computer-implemented method, includes: mapping, prior to performing a Unicode conversion of a productive system and during an uptime processing stage of the productive system, files in the productive system to a cluster file system; generating, prior to the Unicode conversion and during an uptime processing stage of the productive system, a clone system of the productive system using the cluster file system; testing, prior to the Unicode conversion and during an uptime processing stage of the productive system, the clone system; performing, during a downtime processing stage of the productive system, the Unicode conversion; and activating the clone system, including making the clone system the productive system.

With the objectives of minimizing the downtime and simplifying the rollback process, a server or servers can be attached to the production systems through cluster file systems to serve as a clone. Having more than one server in the clone can enable a parallel import process and even less downtime. New file systems can be created in the cluster file system to store the data of the clone system. The file systems that are being used by the production system may not be visible or may not be mounted in the new servers that will serve as a clone. This is to avoid accidental delete or update of production data during the testing phase. On the other hand, clone file systems can be visible by the production system. This is to enable a simple files relinking process once the conversion is successful in the clone. The conversion can happen online if the database does not incorporate business data update. An example for that is specific portal systems. Once the conversion is completed, the production system can be shut down, and files can be relinked to the new Unicode file systems. Then the system can be started. On the other hand, if the database incorporates business data updates, the conversion can be done during the downtime to avoid delta data loss. Then, the same relinking process can be applied upon a successful conversion on the clone. Having a new clone system can minimize the downtime of the conversion since the export of data from the non-Unicode system can be done in parallel with the import of data on the clone system. Having the clone system on the same cluster file system can make the activation of the Unicode system faster through a relinking process and can make the rollback to the non-Unicode system simple by a relinking process. Having production file systems not visible in the clone can protect against human errors and accidental deletion of data. Having two identical systems with the same name running on the same cluster file system can require re-engineering or restructuring since the same mount point cannot be used for different file systems within the same cluster. The re-engineering can be achieved by relocating the base directory to a new one and using links in local file systems to point to original locations for both the production and the clone.

Unicode conversion can be a challenging process and can create or be associated with data loss risk, long downtime, and long rollback duration. In some implementations, techniques described in the present disclosure for Unicode conversion can also be used for applying critical database updates, migrating to new homogeneous hardware, and managing a standby database for mission critical production systems.

Techniques can include building a Unicode clone of a production system. The clone system can be identical in terms of business data. Cluster file systems can be attached to the clone system and the production system. Cluster file systems can include any file system that can be seen and updated by multiple servers simultaneously and supported by a Relational Database Management system in use by the production system.

Different methodologies can be used for distributing the file systems across the production system and the clone system. Specific file systems can be visible and can be updated by both the production system and the clone system. However, file systems that host production data are not to be mounted in the clone system, or visible to the clone. The reasoning behind this is to protect production data against accidental modification during the test phase by the clone system.

Upon a successful conversion on the clone system, a successful critical database update, or the demand to use a standby system following corruption in production data, the current production system can be shutdown, file systems can be relinked toward the clone system, and the clone database system can be started as a production system. Operation can resume immediately without having to update firewall policies or direct the users to new URLs. All of this can be transparent and invisible to end users.

Techniques described within the present disclosure can include a methodology to roll back the conversion or critical database update using a stop, relink, and start process. Conversion to Unicode or a critical database update may fail due to unforeseen events or for various reasons. Links can be re-pointed to the original non-Unicode data files, which can also occur for the critical database update. The links in this case can be re-pointed to the original system prior to the critical update. Finally, in the case of standby system activation, the standby system in this case can become the production system. After resolving the hardware failure in the original production system, the production data can be copied to the standby system that is then marked as a clone system, serving as a standby system to be used in case of future hardware failures.

The previously described implementation is implementable using a computer-implemented method; a non-transitory, computer-readable medium storing computer-readable instructions to perform the computer-implemented method; and a computer-implemented system comprising a computer memory interoperably coupled with a hardware processor configured to perform the computer-implemented method/the instructions stored on the non-transitory, computer-readable medium.

The subject matter described in this specification can be implemented in particular implementations, so as to realize one or more of the following advantages. First, downtime and risks associated with Unicode conversion are reduced. Second, the complexity of rollback during Unicode conversion is reduced. Other advantages will be apparent to those of ordinary skill in the art.

The details of one or more implementations of the subject matter of this specification are set forth in the Detailed Description, the claims, and the accompanying drawings, and the claims. Other features, aspects, and advantages of the subject matter will become apparent from the Detailed Description, the claims, and the accompanying drawings.

DESCRIPTION OF DRAWINGS

Like reference numbers and designations in the various drawings indicate like elements.

DETAILED DESCRIPTION

The following detailed description describes techniques for Unicode conversion and is presented to enable any person skilled in the art to make and use the disclosed subject matter in the context of one or more particular implementations. Various modifications, alterations, and permutations of the disclosed implementations can be made and will be readily apparent to those or ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

The techniques described in the present disclosure allow Unicode conversion to occur with minimized downtime and rollback simplification. Downtime minimization can be achieved, for example, by allowing the target system to be built, prepared, and tested before the downtime. In conventional approaches, the creation and testing of functionality of converted systems is done in the middle of downtime, which can take several hours to complete. Through the use of the techniques of the present disclosure, the creation and functional testing of a Unicode system can be done during the uptime. In this way, the operational risk can be minimalized for a conversion, such as for an enterprise resource planning (ERP) system or core business systems.

Figure 1:
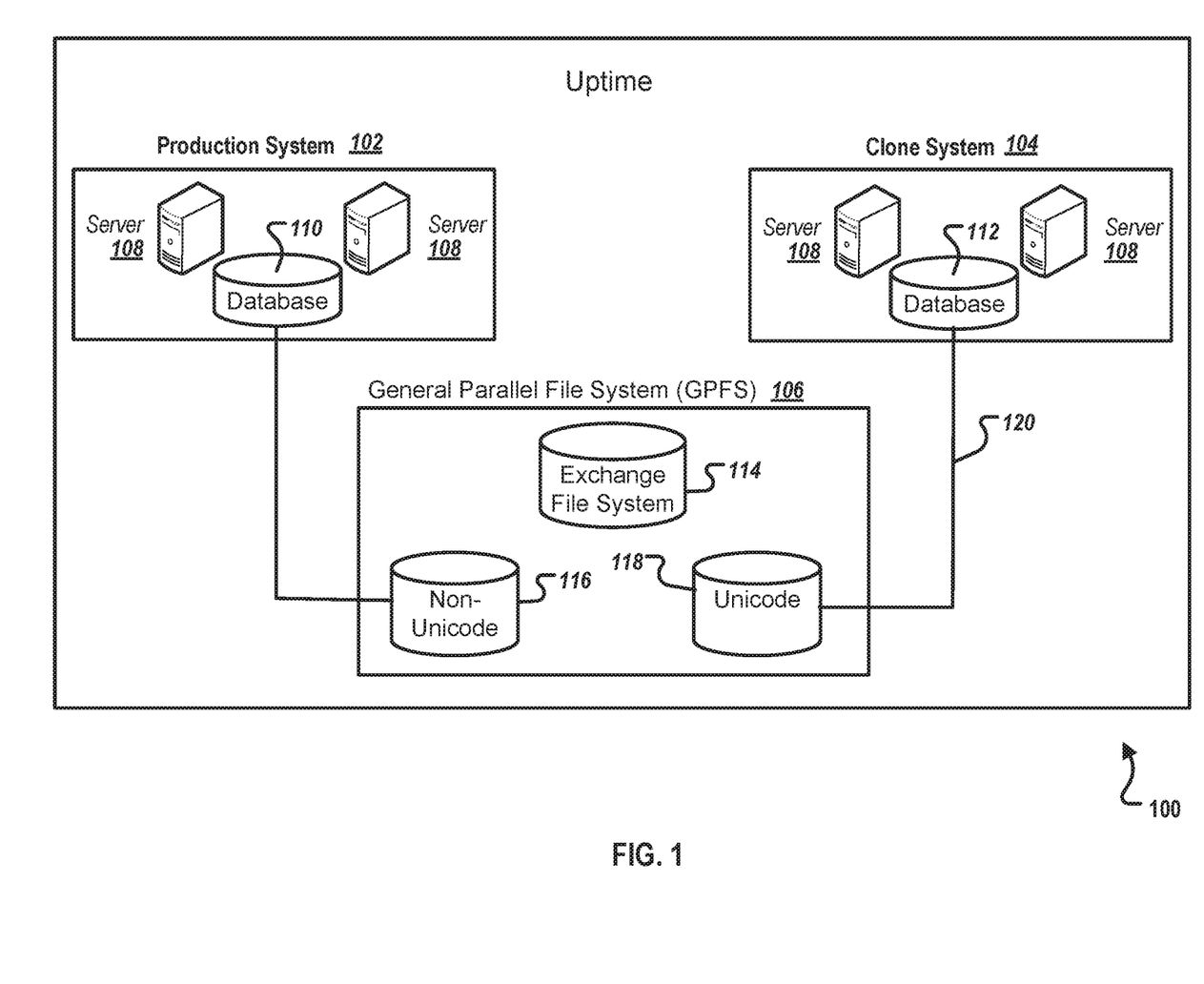
FIG. 1 is a block diagram illustrating an example of an uptime processing stage of a system for performing a Unicode conversion, according to some implementations of the present disclosure.
Figure 2:
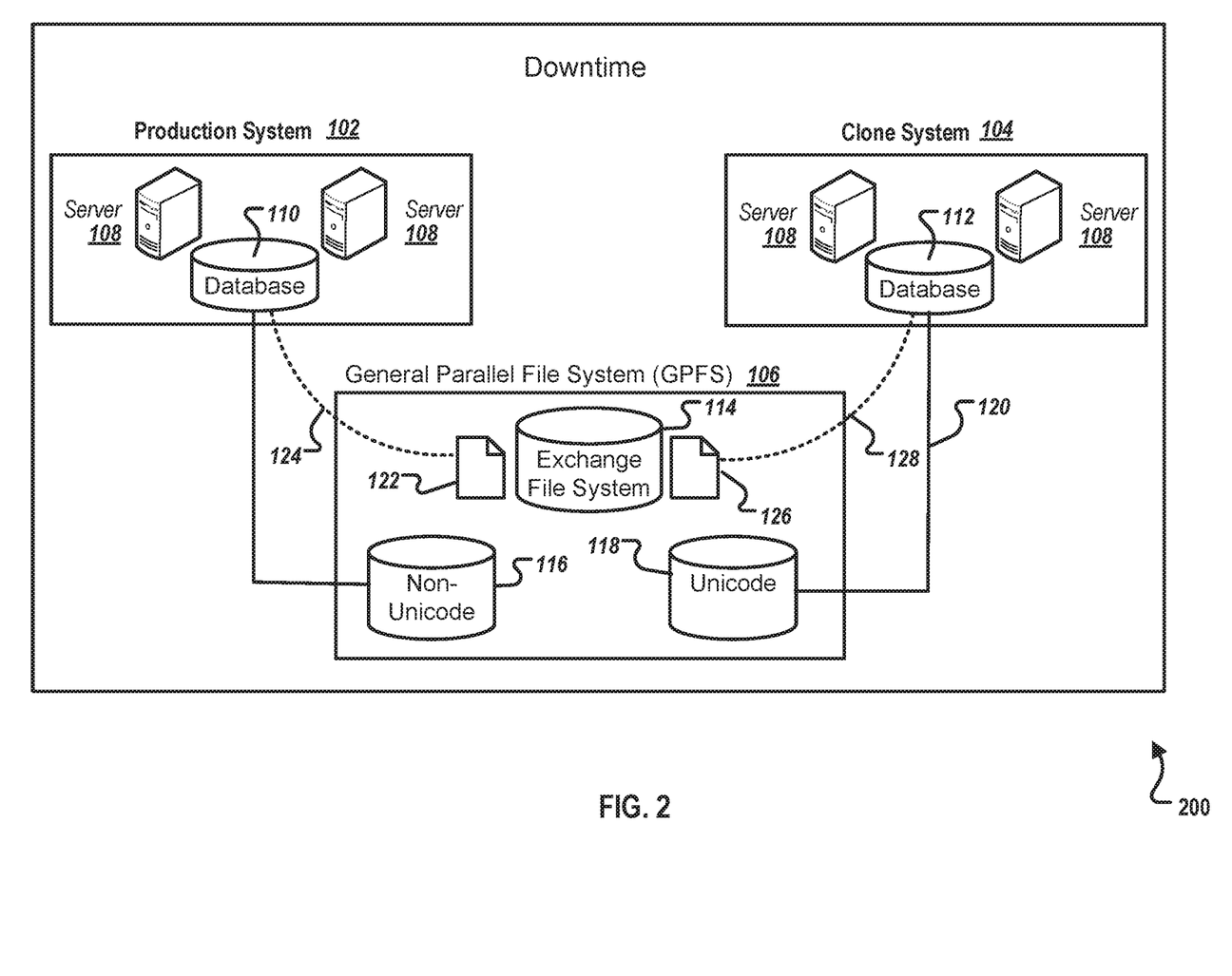
FIG. 2 is a block diagram illustrating an example of a downtime processing stage of the system for performing the Unicode conversion, according to some implementations of the present disclosure.
Figure 3:
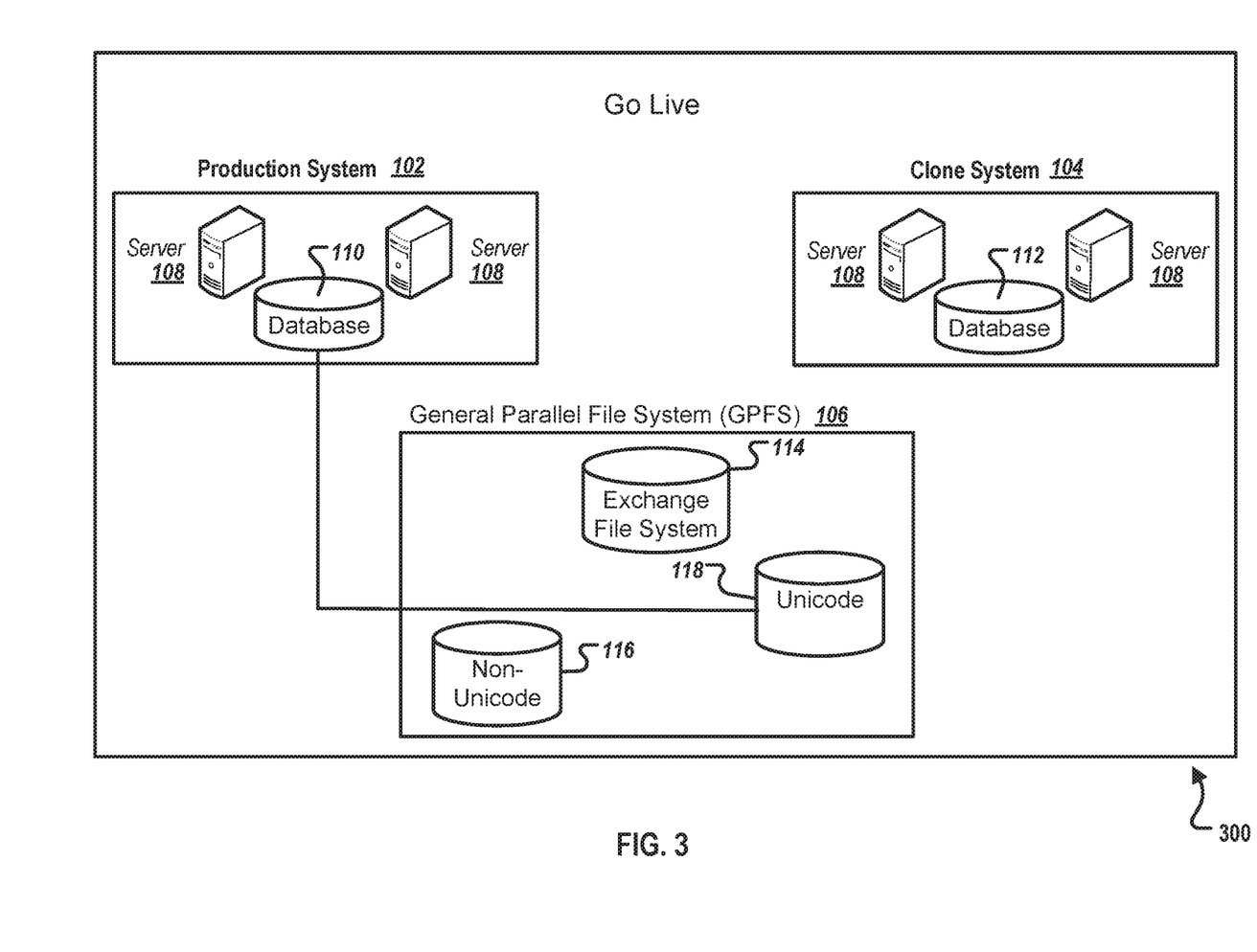
FIG. 3 is a block diagram illustrating an example of go-live processing stage of the system for performing the Unicode conversion, according to some implementations of the present disclosure.

FIG. 1 is a block diagram illustrating an example of an uptime processing stage of a system 100 for performing a Unicode conversion, according to an implementation of the present disclosure. The uptime processing stage is the first of three stages that are depicted in FIGS. 1-3. The system 100 includes a production system 102 and a clone system 104. The production system 102 is to undergo a Unicode conversion under the system 100. The creation and use of the clone system 104 enables the existence of the uptime processing stage. This allows the production system 102 to remain in a production state while the clone system 104 is being created and tested prior to an actual conversion of non-Unicode information to Unicode equivalents.

The system 100 includes a general parallel file system (GPFS) 106 that facilitates the Unicode conversion of the production system 102, including supporting the initial creation of the clone system 104. The GPFS 106 can enable the production system 102 and the clone system 104 to run in parallel. The GPFS 106 can be implemented as a cluster file system, a shared file system, or can use other file systems that provide for parallel systems.

Servers 108 included in each of the production system 102 and the clone system 104 provide access to respective databases of each system. The production system 102 includes a non-Unicode database 110 that includes a non-Unicode character set. The clone system 104 includes a Unicode database 112 that includes a Unicode character set.

During the uptime processing stage of the production system 102, the database 112 on the clone system 104 can be created using the GPFS 106. The database 112 can also be populated with data that is used to test the clone system 104 during the uptime processing stage to assure that the conversion process will run smoothly and that the clone system 104 functions correctly. A process that includes creation and testing of a clone system can assure that, after the full Unicode conversion has completed, the production system 102 will operate correctly after going live. The GPFS 106 includes an exchange file system 114 which includes a mapping of files on the servers 108 of the production system 102 and the clone system 104. The exchange file system 114 uses a non-Unicode database 116 and a Unicode database 118 in order to create the database 112 as a Unicode version of the non-Unicode database 110.

In some implementations, testing of the clone system 104 can include a test of the conversion process for a portion of the non-Unicode database 110, such as to populate a test set of information in the database 112. Upon successful testing of the clone system 104, the test set of information can be deleted at the end of the uptime processing stage and before the downtime processing stage in which all of the production data in the non-Unicode database 110 is to be converted to Unicode.

In some implementations, the testing phase can identify specific instances of non-Unicode data may not convert well to a Unicode equivalent. As part of the testing phase, the specific instances can be provided in a user interface. A user can use the user interface to view the specific instance and identify, such as through selections from lists or by providing user input, specific Unicode equivalents to be used during the actual Unicode conversion. The user selections can be saved, such as to generate instructions or rule sets to be used during the actual conversion. In some implementations, the testing phase can provide one or more suggestions for the specific instances. The user can select a suggestion or provide a Unicode equivalent to be used for particular specific instances or for other specific instances that are similar.

FIG. 2 is a block diagram illustrating an example of a downtime processing stage of the system 100 for performing the Unicode conversion, according to some implementations of the present disclosure. The downtime processing stage includes the actual conversion of non-Unicode documents to Unicode documents. During the downtime processing stage, documents 122 that are exported (124) from the production system 102 are used to create documents 126 that are imported (128) by the clone system 104.

FIG. 3 is a block diagram illustrating an example of go-live processing stage of the system 100 for performing the Unicode conversion, according to some implementations of the present disclosure. During this stage, the non-Unicode database 110 of the production system 102 is connected to the Unicode features of the GPFS 106.

In some implementations, techniques for Unicode conversion can include the use of a cluster file system or a shared file system. To protect against accidental update or deletion of production data during a preparation phase of the Unicode conversion, file systems that host production data are not mounted in target hosts. In addition, compared to other techniques that use, for example, Oracle flashback or database triggers, no impact to the production data is imposed.

Table 1 represents an example of file systems to be mounted across 4 servers for the system 100. The predefined set of remapping assignments in Table 1 of particular paths to particular servers can be used, for example, to implement the exchange file system 114. The four servers can correspond, for example, to the servers 108, where servers Srv1 and Srv2 are on the production system 102 and servers Srv3 and Srv4 are on the clone system 104. Reassignments can occur, for example, using database paths, user paths, and system paths, as shown in Table 1:

TABLE 1

Example Mounting of File Systems

| File System Type | File System | Srv1 | Srv2 | Srv3 | Srv4 | Note |
|---|---|---|---|---|---|---|
| Shared File System | /oracle/OCRvoting1 | x | x | | | |
| | /oracle/OCRvoting2 | x | x | | | |
| | /oracle/OCRvoting3 | x | x | | | |
| | /oracle/NCRsrc | x | x | | | Link /oracle/NCR to /oracle/NCRsrc. The requirement here is a soft link using "ln -s" command. Example of execution in "SRV1" is, cd /oracle Ln -s NCRsrc NCR |
| | /oracle/NCRsrc/SYSdP1Source | x | x | | | |
| | /oracle/NCRsrc/mirrlogA | x | x | | | |
| | /oracle/NCRsrc/mirrlogB | x | x | | | |
| | /oracle/NCRsrc/origlogA | x | x | | | |
| | /oracle/NCRsrc/origlogB | x | x | | | |
| | /oracle/NCRsrc/oraarch | x | x | | | |
| | /SYSmnt/NCR | x | x | | | |
| | /usr/SYS/NCR | x | x | | | |
| | /usr/SYS/NCR/trans | x | x | | | |
| | /oracle2/OCRvoting1 | | | x | x | Link /oracle/OCRvoting1 to /oracle2/OCRvoting1. The requirement here is a soft link using "ln -s" command. Example of execution is, cd /oracle Ln -s /oracle2/OCRvoting1 |
| | /oracle2/OCRvoting2 | | | x | x | Link /oracle/OCRvoting2 to /oracle2/OCRvoting2 |
| | /oracle2/OCRvoting3 | | | x | x | Link /oracle/OCRvoting3 to /oracle2/OCRvoting3 |
| | /oracle/NCRClone | x | x | x | x | Link /oracle/NCR to /oracle/NCRClone in servers Srv3 and Srv4 |
| | /oracle/NCRClone/SYSdP1Target | x | x | x | x | |
| | /oracle/NCRClone/mirrlogA | x | x | x | x | |
| | /oracle/NCRClone/mirrlogB | x | x | x | x | |
| | /oracle/NCRClone/origlogA | x | x | x | x | |
| | /oracle/NCRClone/origlogB | x | x | x | x | |
| | /oracle/NCRClone/oraarch | x | x | x | x | |
| | /Exportimport | x | x | x | x | |
| | /SYSmnt/NCRClone | x | x | x | x | Link /SYSmnt/NCR to /SYSmnt/NCRClone in servers Srv3 and Srv4 |
| | /usr/SYS/NCRClone | x | x | x | x | Link /usr/SYS/NCR to /usr/SYS/NCRClone in servers Srv3 and Srv4 |
| | /usr/SYS/NCRClone/trans | x | x | x | x | |

TABLE 1-continued

Example Mounting of File Systems

| File System Type | File System | Srv1 | Srv2 | Srv3 | Srv4 | Note |
|---|---|---|---|---|---|---|
| Local File System | /oracle | x | | | | This is a local file system in "SRV1" and not shared in SRV2, SRV3 or SRV4. |
| | /oracle | | x | | | |
| | /oracle | | | x | | |
| | /oracle | | | | x | |
| | /usr/SYS | x | | | | |
| | /usr/SYS | | x | | | |
| | /usr/SYS | | | x | | |
| | /usr/SYS | | | | x | |
| | /SYSmnt | x | | | | |
| | /SYSmnt | | x | | | |
| | /SYSmnt | | | x | | |
| | /SYSmnt | | | | x | |

As shown in Table 1, the Unicode system can be installed on servers Srv3 and Srv4. The "SYS" component in the path names in Table 1 can represent, for example, a system name for an enterprise resource planning application environment or other system that is undergoing the Unicode conversion. The non-Unicode system can continue running on servers Srv1 and Srv2 before the Unicode conversion. To allow for the conversion to be enabled ahead of the downtime, the /oracle/NCR mount point can be renamed to /oracle/NCRsrc. A link can be created in servers Srv1 and Srv2 as /oracle/NCR to /oracle/NCRsrc. A Unicode database can be created in servers Srv3 and Srv4. Local links in Srv3 and Srv4 can be created as /oracle/NCR to /oracle/NCRclone. Since Oracle real application cluster standard voting and Oracle Cluster Repository (OCR) disks are located under /oracle/OCRvotingx, the mount point can be changed to /oracle2/OCRvotingx. A link can be created locally from /oracle/OCRvotingx toward /oracle2/OCRvotingx in servers Srv3 and Srv4. This is to avoid file systems naming conflict in Cluster File Systems.

Rollback is simplified using techniques of the present disclosure, as rollback requires only a stop, a relink, and a start. To make this possible, the file system assignments can be re-engineered, for example, using the following. The data home file system of production data can be renamed to /<dbplatform>/<SID>src, where SID is a system ID. Since there is a dependency on the data home file system name, and in order to prevent the need to modify pointers, a link can be created to /<dbplatform>/<SID>src as /<dbplatform>/<SID>. To avoid any conflict between source and target, /<dbplatform> can be created as a local file system. Another file system can be created as /<dbplatform>/<SID>Clone. This file system can be a global file system that is visible by the source and the target. On the other hand, /<dbplatform>/<SID>src can typically be visible only from source. In the target system, a link can be created to /<dbplatform>/<SID>Clone as /<dbplatform>/<SID>. All migration, upgrades, verifications preparation can be done on the target host on /<dbplatform>/<SID>Clone during the uptime processing stage. Delta updates can be shipped from /<dbplatform>/<SID>src running on the source server to /<dbplatform>/<SID>Clone running on the target server during downtime. Data verification can be done on the target as well. Once integrity has been verified, the /<dbplatform>/<SID> link can be switched on the source from /<dbplatform>/<SID>src to /<dbplatform>/<SID>Clone. If there is a requirement to rollback, the system can be stopped on the source. Then, the link can be switched from /<dbplatform>/<SID>Clone to /<dbplatform>/<SID>src.

The techniques of the present disclosure can be applied to several ERP operational use cases, including Unicode conversion, homogeneous hardware migration, standby (for example, to protect against human error), and critical database updates (for example, to complete the update and roll out a new solution). For example, in the case of a hardware migration, instead of switching the link on the source, the system can be started on the target after successful verification. In the case of a failure to start on the target, the original system, which is protected, can be stopped and restarted.

In some implementations, since global file systems do not allow using the same mount point names from different disks, the cluster can be re-engineered to enable the normal operation without impacting any future upgrade. Voting and cluster shared data can be relocated to a new file system. A link from a local file system on the target can be created to connect to the shared voting and cluster repository files.

Figure 4:
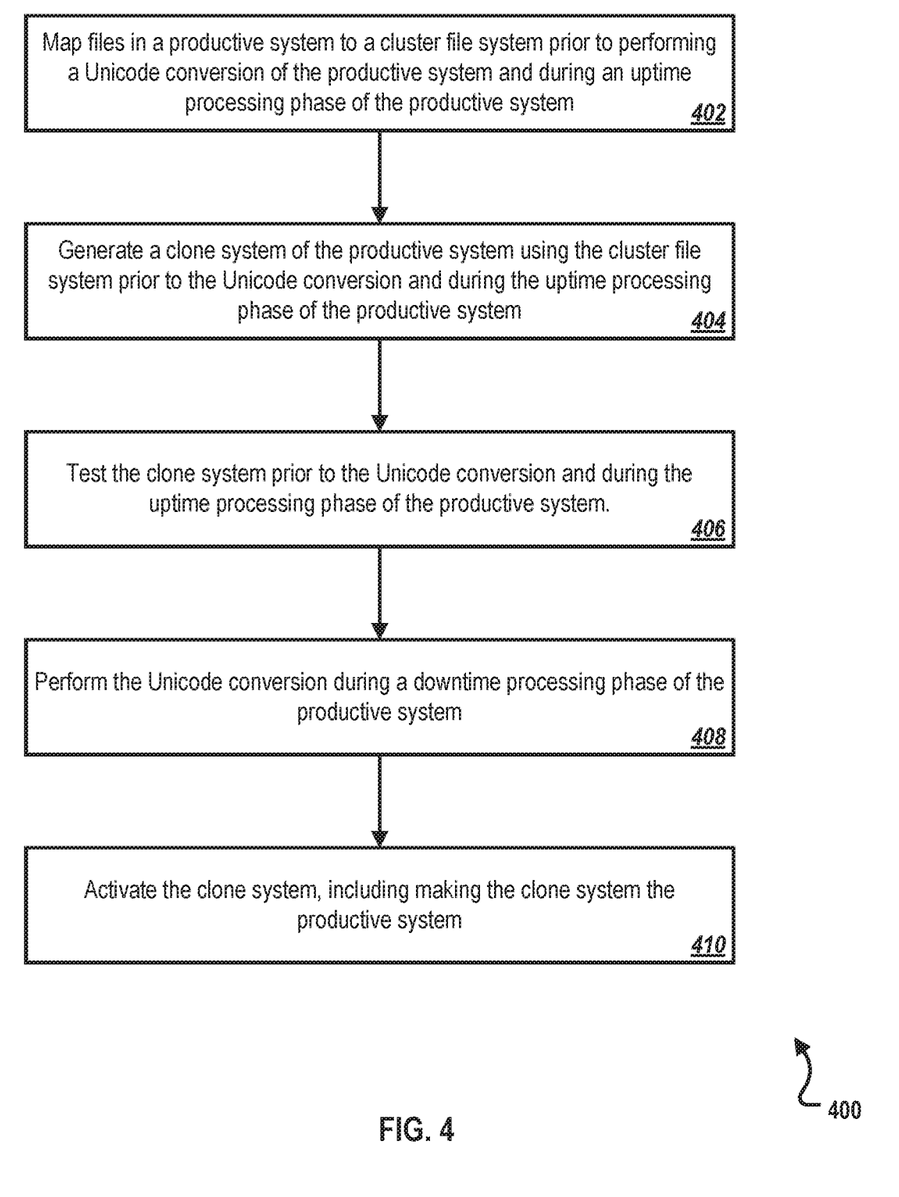
FIG. 4 is a flowchart of an example method for performing a Unicode conversion, according to some implementations of the present disclosure.

FIG. 4 is a flowchart of an example method 400 for performing a Unicode conversion, according to some implementations of the present disclosure. For clarity of presentation, the description that follows generally describes method 400 in the context of the other figures in this description. However, it will be understood that method 400 may be performed, for example, by any suitable system, environment, software, and hardware, or a combination of systems, environments, software, and hardware, as appropriate. In some implementations, various steps of method 400 can be run in parallel, in combination, in loops, or in any order.

At 402, prior to performing a Unicode conversion of a productive system and during an uptime processing stage of the productive system, files in the productive system are mapped to a cluster file system. For example, file mappings can be made by the GPFS 106 and according to Table 1, using a pre-defined set of remapping assignments. From 402, method 400 proceeds to 404.

At 404, prior to the Unicode conversion and during the uptime processing stage of the productive system, a clone system of the productive system is generated using the cluster file system. This can occur during the uptime processing phase depicted in FIG. 1. As an example, the clone system 104 can be created in the system 100. From 402, method 400 proceeds to 404.

At 406, prior to the Unicode conversion and during the uptime processing stage of the productive system, the clone system is tested. For example, users can perform tests on the clone system 104 to assure that the clone system 104 is operating correctly. This can also occur during the uptime processing phase depicted in FIG. 1. From 402, method 400 proceeds to 404.

At 408, the Unicode conversion is performed during a downtime of the productive system. As an example, the non-Unicode database 110 is converted to Unicode. The conversion can occur, for example, using an export/import sequence as depicted in FIG. 2. From 402, method 400 proceeds to 404.

At 410, the clone system is activated, including making the clone system the productive system. For example, the production system 102 can go live by making the clone system 104 the new productive system, as depicted in FIG. 3. After 410, method 400 stops.

In some implementations, method 400 further includes providing protection of data by hiding production data from the clone system. For example, this approach can guarantee protection against human error that may occur during the test phase. In some implementations, the database does not include business data updates during the conversion, and the downtime can require a stop, a relink, and a start of the system as Unicode.

Figure 5:
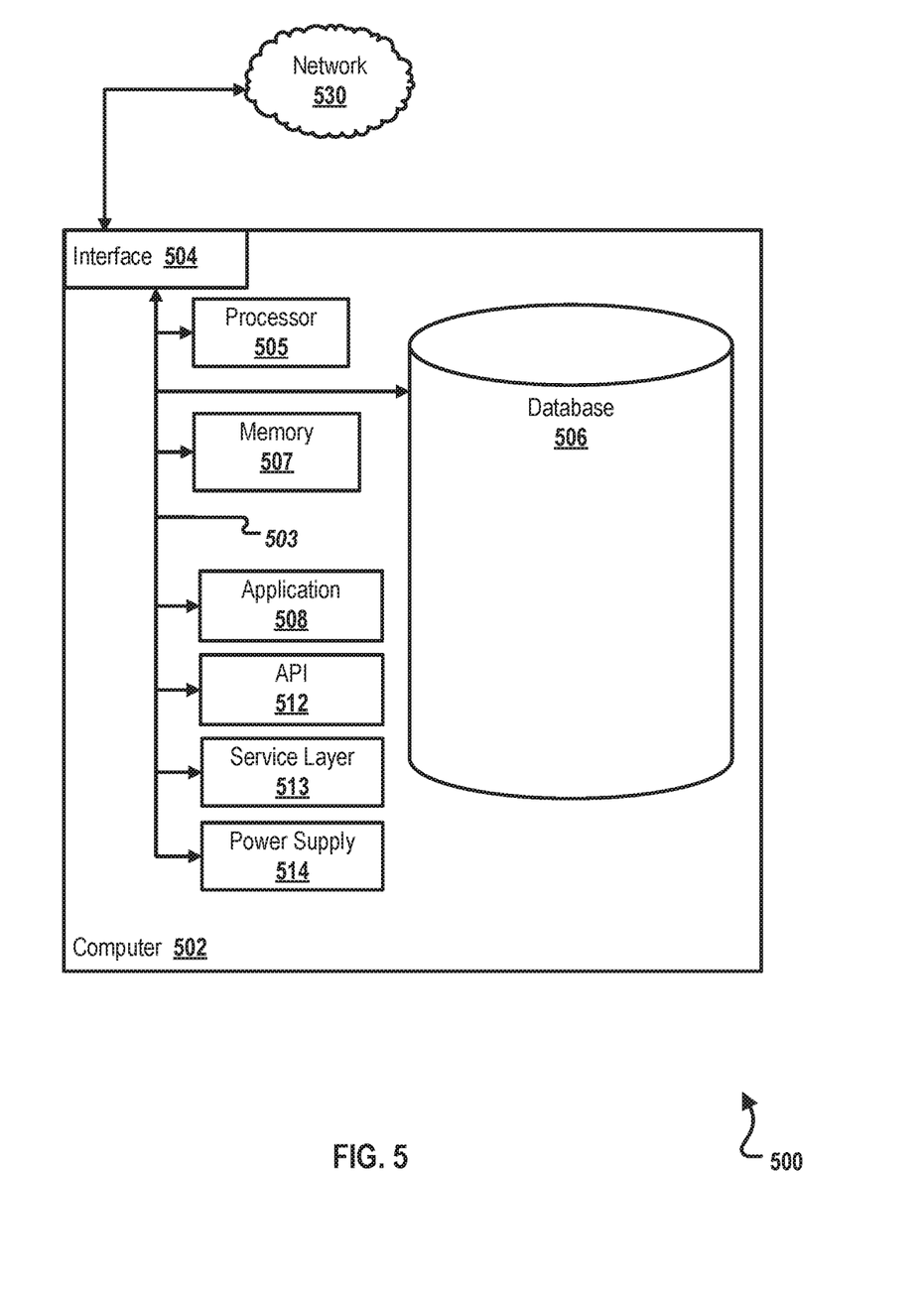
FIG. 5 is a block diagram illustrating an example computer system used to provide computational functionalities associated with described algorithms, methods, functions, processes, flows, and procedures as described in the instant disclosure, according to some implementations of the present disclosure.

FIG. 5 is a block diagram of an example computer system 500 used to provide computational functionalities associated with described algorithms, methods, functions, processes, flows, and procedures, as described in the instant disclosure, according to some implementations of the present disclosure. The illustrated computer 502 is intended to encompass any computing device such as a server, desktop computer, laptop/notebook computer, wireless data port, smart phone, personal data assistant (PDA), tablet computing device, one or more processors within these devices, or any other suitable processing device, including physical or virtual instances (or both) of the computing device. Additionally, the computer 502 may comprise a computer that includes an input device, such as a keypad, keyboard, touch screen, or other device that can accept user information, and an output device that conveys information associated with the operation of the computer 502, including digital data, visual, or audio information (or a combination of information), or a graphical-type user interface (UI) (or GUI).

The computer 502 can serve in a role as a client, network component, a server, a database or other persistency, or any other component (or a combination of roles) of a computer system for performing the subject matter described in the instant disclosure. The illustrated computer 502 is communicably coupled with a network 530. In some implementations, one or more components of the computer 502 may be configured to operate within environments, including cloud-computing-based, local, global, or other environment (or a combination of environments).

At a high level, the computer 502 is an electronic computing device operable to receive, transmit, process, store, or manage data and information associated with the described subject matter. According to some implementations, the computer 502 may also include or be communicably coupled with an application server, e-mail server, web server, caching server, streaming data server, or other server (or a combination of servers).

The computer 502 can receive requests over network 530 from a client application (for example, executing on another computer 502) and respond to the received requests by processing the received requests using an appropriate software application(s). In addition, requests may also be sent to the computer 502 from internal users (for example, from a command console or by other appropriate access method), external or third-parties, other automated applications, as well as any other appropriate entities, individuals, systems, or computers.

Each of the components of the computer 502 can communicate using a system bus 503. In some implementations, any or all of the components of the computer 502, hardware or software (or a combination of both hardware and software), may interface with each other or the interface 504 (or a combination of both), over the system bus 503 using an application programming interface (API) 512 or a service layer 513 (or a combination of the API 512 and service layer 513). The API 512 may include specifications for routines, data structures, and object classes. The API 512 may be either computer-language independent or dependent and refer to a complete interface, a single function, or even a set of APIs. The service layer 513 provides software services to the computer 502 or other components (whether or not illustrated) that are communicably coupled to the computer 502. The functionality of the computer 502 may be accessible for all service consumers using this service layer. Software services, such as those provided by the service layer 513, provide reusable, defined functionalities through a defined interface. For example, the interface may be software written in JAVA, C++, or other suitable language providing data in extensible markup language (XML) format or other suitable format. While illustrated as an integrated component of the computer 502, alternative implementations may illustrate the API 512 or the service layer 513 as stand-alone components in relation to other components of the computer 502 or other components (whether or not illustrated) that are communicably coupled to the computer 502. Moreover, any or all parts of the API 512 or the service layer 513 may be implemented as child or sub-modules of another software module, enterprise application, or hardware module without departing from the scope of this disclosure.

The computer 502 includes an interface 504. Although illustrated as a single interface 504 in FIG. 5, two or more interfaces 504 may be used according to particular needs, desires, or particular implementations of the computer 502. The interface 504 is used by the computer 502 for communicating with other systems that are connected to the network 530 (whether illustrated or not) in a distributed environment. Generally, the interface 504 comprises logic encoded in software or hardware (or a combination of software and hardware) and is operable to communicate with the network 530. More specifically, the interface 504 may comprise software supporting one or more communication protocols associated with communications such that the network 530 or interface's hardware is operable to communicate physical signals within and outside of the illustrated computer 502.

The computer 502 includes a processor 505. Although illustrated as a single processor 505 in FIG. 5, two or more processors may be used according to particular needs, desires, or particular implementations of the computer 502. Generally, the processor 505 executes instructions and manipulates data to perform the operations of the computer 502 and any algorithms, methods, functions, processes, flows, and procedures as described in the instant disclosure.

The computer 502 also includes a database 506 that can hold data for the computer 502 or other components (or a combination of both) that can be connected to the network 530 (whether illustrated or not). For example, database 506 can be an in-memory, conventional, or other type of database storing data consistent with this disclosure. In some implementations, database 506 can be a combination of two or more different database types (for example, a hybrid in-memory and conventional database) according to particular needs, desires, or particular implementations of the computer 502 and the described functionality. Although illustrated as a single database 506 in FIG. 5, two or more databases (of the same or combination of types) can be used according to particular needs, desires, or particular implementations of the computer 502 and the described functionality. While database 506 is illustrated as an integral component of the computer 502, in alternative implementations, database 506 can be external to the computer 502.

The computer 502 also includes a memory 507 that can hold data for the computer 502 or other components (or a combination of both) that can be connected to the network 530 (whether illustrated or not). Memory 507 can store any data consistent with this disclosure. In some implementations, memory 507 can be a combination of two or more different types of memory (for example, a combination of semiconductor and magnetic storage) according to particular needs, desires, or particular implementations of the computer 502 and the described functionality. Although illustrated as a single memory 507 in FIG. 5, two or more memories 507 (of the same or combination of types) can be used according to particular needs, desires, or particular implementations of the computer 502 and the described functionality. While memory 507 is illustrated as an integral component of the computer 502, in alternative implementations, memory 507 can be external to the computer 502.

The application 508 is an algorithmic software engine providing functionality according to particular needs, desires, or particular implementations of the computer 502, particularly with respect to functionality described in this disclosure. For example, application 508 can serve as one or more components, modules, or applications. Further, although illustrated as a single application 508, the application 508 may be implemented as multiple applications 508 on the computer 502. In addition, although illustrated as integral to the computer 502, in alternative implementations, the application 508 can be external to the computer 502.

The computer 502 can also include a power supply 514. The power supply 514 can include a rechargeable or non-rechargeable battery that can be configured to be either user- or non-user-replaceable. In some implementations, the power supply 514 can include power-conversion or management circuits (including recharging, standby, or other power management functionality). In some implementations, the power-supply 514 can include a power plug to allow the computer 502 to be plugged into a wall socket or other power source to, for example, power the computer 502 or recharge a rechargeable battery.

There may be any number of computers 502 associated with, or external to, a computer system containing computer 502, each computer 502 communicating over network 530. Further, the term "client," "user," and other appropriate terminology may be used interchangeably, as appropriate, without departing from the scope of this disclosure. Moreover, this disclosure contemplates that many users may use one computer 502, or that one user may use multiple computers 502.

Figure 6:
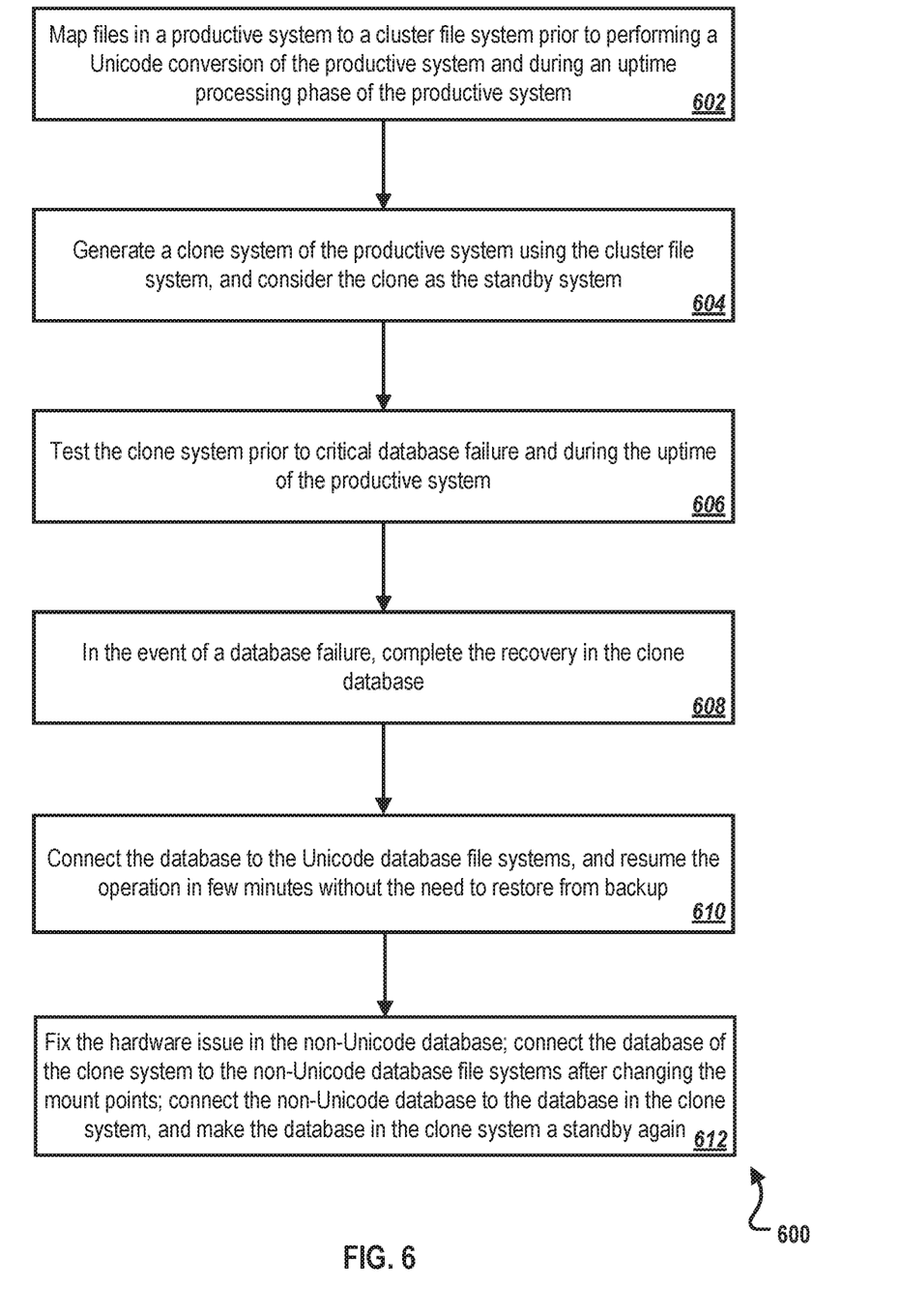
FIG. 6 is a flowchart of an example method for performing a standby scenario of a Unicode conversion, according to some implementations of the present disclosure.

FIG. 6 is a flowchart of an example method 600 for performing a standby scenario of a Unicode conversion, according to some implementations of the present disclosure.

At 602, files in a productive system are mapped to a cluster file system prior to performing a Unicode conversion of the productive system and during an uptime processing phase of the productive system. For example, files in the production system 102 can be mapped to the GPFS 106.

At 604, a clone system of the productive system is generated using the cluster file system. The clone is considered as the standby system. For example, the clone system 104 can be created.

At 606, the clone system is tested prior to the occurrence of a critical database failure and during the uptime of the productive system. For example, during a time that no critical database failure has occurred on the production system 102, the clone system 104 can be tested.

At 608, in the event of a critical database failure of the non-Unicode database 110, the recovery in a clone database is completed. For example, if a critical database failure does happen to occur, the database 112 that functions as a clone database can be used to recover a usable system.

At 610, the non-Unicode database is connected to Unicode database. For example, the non-Unicode database 110 can be connected to Unicode database 118. Operation can resume in few minutes without the need to restore from backup which may take several hours or days depending the backup technology and database size.

At 612, the hardware issue is fixed and the clone database is connected to file systems after changing the mount points. For example, the hardware issue is fixed in the non-Unicode database 116 and the database 112 in the clone system 104 is connected to the non-Unicode database 116 after changing the mount points. The database (for example, non-Unicode database 110) is mapped to database 112. The clone database 112 becomes a standby again, working on non-Unicode database 116 fixed file systems.

Figure 7:
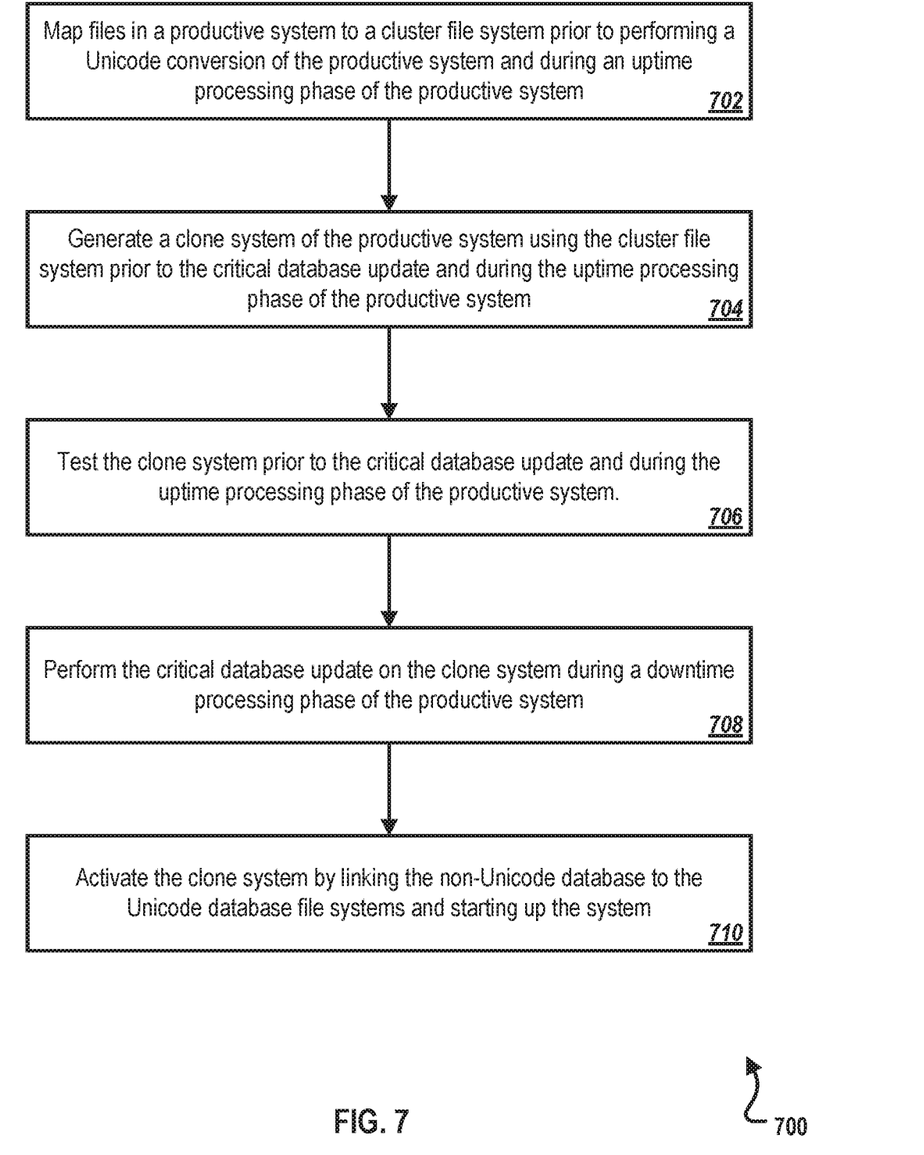
FIG. 7 is a flowchart of an example method for performing a critical database update scenario of a Unicode conversion, according to some implementations of the present disclosure.

FIG. 7 is a flowchart of an example method 700 for performing a critical database update scenario of a Unicode conversion, according to some implementations of the present disclosure.

At 702, files in a productive system are mapped to a cluster file system prior to performing a Unicode conversion of the productive system and during an uptime processing phase of the productive system. For example, files in the production system 102 can be mapped to the GPFS 106.

At 704, a clone system of the productive system is generated using the cluster file system prior to the critical database update and during the uptime processing phase of the productive system. For example, the clone system 104 can be created.

At 706, the clone system is tested prior to the critical database update and during the uptime processing phase of the productive system. For example, the clone system 104 can be tested during the time before the critical database update is to occur.

At 708, the critical database update is performed on the clone system, for example, the clone system 104, during a downtime processing phase of the productive system.

At 710, the clone system is activated. For example, activation includes linking the non-Unicode database 110 to the Unicode database 118 and starting the system.

Described implementations of the subject matter can include one or more features, alone or in combination.

For example, in a first implementation, a computer-implemented method, comprising: mapping, prior to performing a Unicode conversion of a productive system and during an uptime processing stage of the productive system, files in the productive system to a cluster file system; generating, prior to the Unicode conversion and during an uptime processing stage of the productive system, a clone system of the productive system using the cluster file system; testing, prior to the Unicode conversion and during an uptime processing stage of the productive system, the clone system; performing, during a downtime processing stage of the productive system, the Unicode conversion; and activating the clone system, including making the clone system the productive system.

The foregoing and other described implementations can each, optionally, include one or more of the following features:

A first feature, combinable with any of the following features, the method further comprising: determining that rollback is to occur; stopping the conversion; relinking the files in the productive system to their original values; and restarting the productive system.

A second feature, combinable with any of the previous or following features, wherein mapping the files in the productive system to the cluster file system uses a pre-defined set of remapping assignments.

A third feature, combinable with any of the previous or following features, the method further comprising applying the mapping and steps of the Unicode conversion to one or more of a homogeneous hardware migration, a standby of the production system, or a critical database update.

A fourth feature, combinable with any of the previous or following features, wherein mapping the files includes mapping of database paths, user paths, and system paths.

A fifth feature, combinable with any of the previous or following features, the method further comprising providing protection of data by hiding production data from the clone system.

A sixth feature, combinable with any of the previous or following features, the database does not include business data updates during the conversion, and wherein the downtime requires a stop, a relink, and a start of the system as Unicode.

In a second implementation, a non-transitory, computer-readable medium storing one or more instructions executable by a computer system to perform operations comprising: mapping, prior to performing a Unicode conversion of a productive system and during an uptime processing stage of the productive system, files in the productive system to a cluster file system; generating, prior to the Unicode conversion and during an uptime processing stage of the productive system, a clone system of the productive system using the cluster file system; testing, prior to the Unicode conversion and during an uptime processing stage of the productive system, the clone system; performing, during a downtime processing stage of the productive system, the Unicode conversion; and activating the clone system, including making the clone system the productive system.

The foregoing and other described implementations can each, optionally, include one or more of the following features:

A first feature, combinable with any of the following features, the operations further comprising: determining that rollback is to occur; stopping the conversion; relinking the files in the productive system to their original values; and restarting the productive system.

A second feature, combinable with any of the previous or following features, wherein mapping the files in the productive system to the cluster file system uses a pre-defined set of remapping assignments.

A third feature, combinable with any of the previous or following features, the operations further comprising applying the mapping and steps of the Unicode conversion to one or more of a homogeneous hardware migration, a standby of the production system, or a critical database update.

A fourth feature, combinable with any of the previous or following features, wherein mapping the files includes mapping of database paths, user paths, and system paths.

A fifth feature, combinable with any of the previous or following features, the operations further comprising providing protection of data by hiding production data from the clone system.

A sixth feature, combinable with any of the previous or following features, the database does not include business data updates during the conversion, and wherein the downtime requires a stop, a relink, and a start of the system as Unicode.

In a third implementation, a computer-implemented system, comprising: a computer memory; and a hardware processor interoperably coupled with the computer memory and configured to perform operations comprising: mapping, prior to performing a Unicode conversion of a productive system and during an uptime processing stage of the productive system, files in the productive system to a cluster file system; generating, prior to the Unicode conversion and during an uptime processing stage of the productive system, a clone system of the productive system using the cluster file system; testing, prior to the Unicode conversion and during an uptime processing stage of the productive system, the clone system; performing, during a downtime processing stage of the productive system, the Unicode conversion; and activating the clone system, including making the clone system the productive system.

The foregoing and other described implementations can each, optionally, include one or more of the following features:

A first feature, combinable with any of the following features, the operations further comprising: determining that rollback is to occur; stopping the conversion; relinking the files in the productive system to their original values; and restarting the productive system.

A second feature, combinable with any of the previous or following features, wherein mapping the files in the productive system to the cluster file system uses a pre-defined set of remapping assignments.

A third feature, combinable with any of the previous or following features, the operations further comprising applying the mapping and steps of the Unicode conversion to one or more of a homogeneous hardware migration, a standby of the production system, or a critical database update.

A fourth feature, combinable with any of the previous or following features, wherein mapping the files includes mapping of database paths, user paths, and system paths.

A fifth feature, combinable with any of the previous or following features, the operations further comprising providing protection of data by hiding production data from the clone system.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs, that is, one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal, for example, a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be, or further include special purpose logic circuitry, for example, a central processing unit (CPU), an FPGA (field programmable gate array), or an ASIC (application-specific integrated circuit). In some implementations, the data processing apparatus or special purpose logic circuitry (or a combination of the data processing apparatus or special purpose logic circuitry) may be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example LINUX, UNIX, WINDOWS, MAC OS, ANDROID, IOS, or any other suitable conventional operating system.

A computer program, which may also be referred to or described as a program, software, a software application, a module, a software module, a script, or code can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, libraries, and such, as appropriate. Conversely, the features and functionality of various components can be combined into single components, as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on general or special purpose microprocessors, both, or any other kind of CPU. Generally, a CPU will receive instructions and data from and write to a memory. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable storage device, for example, a universal serial bus (USB) flash drive, to name just a few.

Computer-readable media (transitory or non-transitory, as appropriate) suitable for storing computer program instructions and data includes all forms of permanent/non-permanent or volatile/non-volatile memory, media and memory devices, including by way of example semiconductor memory devices, for example, random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices; magnetic devices, for example, tape, cartridges, cassettes, internal/removable disks; magneto-optical disks; and optical memory devices, for example, digital video disc (DVD), CD-ROM, DVD+/−R, DVD-RAM, DVD-ROM, HD-DVD, and BLURAY, and other optical memory technologies. The memory may store various objects or data, including caches, classes, frameworks, applications, modules, backup data, jobs, web pages, web page templates, data structures, database tables, repositories storing dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad by which the user can provide input to the computer. Input may also be provided to the computer using a touchscreen, such as a tablet computer surface with pressure sensitivity, a multi-touch screen using capacitive or electric sensing, or other type of touchscreen. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or "GUI," may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons. These and other UI elements may be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with some implementations of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n or 802.20 (or a combination of 802.11x and 802.20 or other protocols consistent with this disclosure), all or a portion of the Internet, or any other communication system or systems at one or more locations (or a combination of communication networks). The network may communicate with, for example, Internet Protocol (IP) packets, Frame Relay frames, Asynchronous Transfer Mode (ATM) cells, voice, video, data, or other suitable information (or a combination of communication types) between network addresses.

The computing system can include clients and servers. A client and server are generally remote from each other and typically interact through a communication network. The relationship of client and server arises by virtue of computer programs running on the respective computers and having a client-server relationship to each other.

Cluster file system involved in this invention can be any file system type accessible from multiple servers for read and update. Locking or consistency tracking is not necessary in this invention since the locking of exchange file system can be done at application layer. Furthermore, Unicode datafiles are different from non-Unicode datafiles.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain this disclosure. Other changes, substitutions, and alterations are also possible without departing from the spirit and scope of this disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. A computer-implemented method, comprising:
   mapping, prior to performing a Unicode conversion of a productive system and during an uptime processing stage of the productive system, files in the productive system to a cluster file system;
   generating, prior to the Unicode conversion and during an uptime processing stage of the productive system, a clone system of the productive system using the cluster file system, wherein the clone system includes a non-productive copy of the files in the productive system and serves as a standby system to be used in case of future hardware failures in the productive system, and wherein generating the clone system includes:
   relocating a base directory of the productive system to a new directory; and
   using links in local file systems to point to original file locations of the productive system and the clone system;
   testing, prior to the Unicode conversion and during an uptime processing stage of the productive system, the clone system;
   performing, during a downtime processing stage of the productive system, the Unicode conversion; and activating the clone system, including making the clone
system the productive system.

2. The computer-implemented method of claim 1, further comprising:
determining that rollback is to occur;
stopping the Unicode conversion;
relinking the files in the productive system to their original values; and
restarting the productive system.

3. The computer-implemented method of claim 1, wherein mapping the files in the productive system to the cluster file system uses a pre-defined set of remapping assignments.

4. The computer-implemented method of claim 1, further comprising applying the mapping and steps of the Unicode conversion to one or more of a homogeneous hardware migration, a standby of the productive system, or a critical database update.

5. The computer-implemented method of claim 1, wherein mapping the files includes mapping of database paths, user paths, and system paths.

6. The computer-implemented method of claim 1, further comprising providing protection of data by hiding production data from the clone system.

7. The computer-implemented method of claim 1, wherein the downtime processing stage excludes application of business database updates during the Unicode conversion, and wherein the downtime requires a stop, a relink, and a start of the system as Unicode.

8. A non-transitory, computer-readable medium storing one or more instructions executable by a computer system to perform operations comprising:
mapping, prior to performing a Unicode conversion of a productive system and during an uptime processing stage of the productive system, files in the productive system to a cluster file system;
generating, prior to the Unicode conversion and during an uptime processing stage of the productive system, a clone system of the productive system using the cluster file system, wherein the clone system includes a non-productive copy of the files in the productive system and serves as a standby system to be used in case of future hardware failures in the productive system, and wherein generating the clone system includes:
relocating a base directory of the productive system to a new directory; and
using links in local file systems to point to original file locations of the productive system and the clone system;
testing, prior to the Unicode conversion and during an uptime processing stage of the productive system, the clone system;
performing, during a downtime processing stage of the productive system, the Unicode conversion; and
activating the clone system, including making the clone system the productive system.

9. The non-transitory, computer-readable medium of claim 8, the operations further comprising:
determining that rollback is to occur;
stopping the Unicode conversion;
relinking the files in the productive system to their original values; and
restarting the productive system.

10. The non-transitory, computer-readable medium of claim 8, wherein mapping the files in the productive system to the cluster file system uses a pre-defined set of remapping assignments.

11. The non-transitory, computer-readable medium of claim 8, the operations further comprising applying the mapping and steps of the Unicode conversion to one or more of a homogeneous hardware migration, a standby of the productive system, or a critical database update.

12. The non-transitory, computer-readable medium of claim 8, wherein mapping the files includes mapping of database paths, user paths, and system paths.

13. The non-transitory, computer-readable medium of claim 8, the operations further comprising providing protection of data by hiding production data from the clone system.

14. The non-transitory, computer-readable medium of claim 8, wherein the downtime processing stage excludes application of business database updates during the Unicode conversion, and wherein the downtime requires a stop, a relink, and a start of the system as Unicode.

15. A computer-implemented system, comprising:
a computer memory; and
a hardware processor interoperably coupled with the computer memory and configured to perform operations comprising:
mapping, prior to performing a Unicode conversion of a productive system and during an uptime processing stage of the productive system, files in the productive system to a cluster file system;
generating, prior to the Unicode conversion and during an uptime processing stage of the productive system, a clone system of the productive system using the cluster file system, wherein the clone system includes a non-productive copy of the files in the productive system and serves as a standby system to be used in case of future hardware failures in the productive system, and wherein generating the clone system includes:
relocating a base directory of the productive system to a new directory; and
using links in local file systems to point to original file locations of the productive system and the clone system;
testing, prior to the Unicode conversion and during an uptime processing stage of the productive system, the clone system;
performing, during a downtime processing stage of the productive system, the Unicode conversion; and
activating the clone system, including making the clone system the productive system.

16. The computer-implemented system of claim 15, the operations further comprising:
determining that rollback is to occur;
stopping the Unicode conversion;
relinking the files in the productive system to their original values; and
restarting the productive system.

17. The computer-implemented system of claim 15, wherein mapping the files in the productive system to the cluster file system uses a pre-defined set of remapping assignments.

18. The computer-implemented system of claim 15, the operations further comprising applying the mapping and steps of the Unicode conversion to one or more of a homogeneous hardware migration, a standby of the productive system, or a critical database update.

19. The computer-implemented system of claim 15, wherein mapping the files includes mapping of database paths, user paths, and system paths.

20. The computer-implemented system of claim 15, the operations further comprising providing protection of data by hiding production data from the clone system.

\* \* \* \* \*

UNITED STATES PATENT AND TRADEMARK OFFICE
CERTIFICATE OF CORRECTION

PATENT NO. : 10,817,649 B2
APPLICATION NO. : 15/865947
DATED : October 27, 2020
INVENTOR(S) : Tashkandi et al.

Page 1 of 1

It is certified that error appears in the above-identified patent and that said Letters Patent is hereby corrected as shown below:

On the Title Page

Item (73) Assignee, replace "Comapny," with -- Company, --

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*